United States Patent [19]

Miyauchi et al.

[11] Patent Number: 4,817,109
[45] Date of Patent: Mar. 28, 1989

[54] EXTERNAL RESONATOR TYPE SEMICONDUCTOR LASER APPARATUS

[75] Inventors: Nobuybuki Miyauchi, Tenri; Osamu Yamamoto, Nara; Hiroshi Hayashi, Kyoto; Saburo Yamamoto, Nara; Shigeki Maei, Tenri, all of Japan

[73] Assignee: 501 Sharp Kabushiki Kaisha, Osaka, Japan

[21] Appl. No.: 937,969

[22] Filed: Dec. 4, 1986

[30] Foreign Application Priority Data

Dec. 10, 1985 [JP] Japan .................. 60-278698
Jan. 28, 1986 [JP] Japan .................. 61-18697

[51] Int. Cl.$^4$ ............................. H01S 3/08
[52] U.S. Cl. ........................... 372/92; 357/19; 372/18; 372/26; 372/93; 372/98; 372/99; 372/107; 372/50; 372/44
[58] Field of Search ............ 372/50, 36, 92, 98, 372/99, 107, 18, 26, 9, 93; 357/19, 74

[56] References Cited

U.S. PATENT DOCUMENTS 4,287,486 9/1981 Javan ........................... 372/93
4,293,826 10/1981 Scifres et al. .................. 357/19

FOREIGN PATENT DOCUMENTS 3017481 11/1980 Fed. Rep. of Germany .
3342111 5/1984 Fed. Rep. of Germany .
3406838 8/1984 Fed. Rep. of Germany .
0069882 6/1981 Japan ..................... 372/36

OTHER PUBLICATIONS

Elect. Compon. and Appl. (1980) 3:2–5 (No Author) "CQLiO Semiconductor Laser for Information Readout".

Primary Examiner—William L. Sikes
Assistant Examiner—Georgia Y. Epps
Attorney, Agent, or Firm—Irell & Manella

[57] ABSTRACT

An external resonator type semiconductor laser apparatus comprising a semiconductor laser device, a reflector positioned behind said laser device in a manner to face the light-emitting rear facet of said laser device, and a photodetector, for detecting the optical output of said laser device, positioned backward of said reflector, wherein a part of the laser light from said light-emitting rear facet is reflected by said reflector and the reflected light is then incident to said photodetector.

5 Claims, 5 Drawing Sheets

EXTERNAL RESONATOR TYPE SEMICONDUCTOR LASER APPARATUS

BACKGROUND OF THE INVENTION

1. Field of the Invention

This invention relates to a semiconductor laser apparatus producing laser light with a stabilized oscillation wavelength, which can be used as a coherent light source in an optical communication system, an optical measuring system, an optical information processing system, etc.

2. Description of the Prior Art

With the enlarged use of semiconductor lasers in fields such as optical communication, optical measurement, optical information processing, etc., semiconductor lasers producing laser light with a stabilized oscillation wavelength are required as a light source. Semiconductor lasers ordinarily produce laser light having an oscillation wavelength that continuously or discontinuously varies with a variation in temperatures and/or current. This variation in an oscillation wavelength causes optical output noise, which causes a decrease in the performance of the optical system containing these semiconductor lasers therein. In order to eliminate these problems, external resonator type semiconductor lasers have been developed. FIG. 5 shows a conventional external resonator type semiconductor laser in which a semiconductor laser device 1 is mounted on a base 2 in such a manner that the epitaxial growth layer side of the laser device 1 faces the base 2 so as to improve the radiation of heat. Laser light emitted from the front facet 13 of the active layer 10 of the laser device 1, which is located at a distance of several μm or less from the base 2, is radiated to the outside through a window 5. The base 2 is fixed to a table 6 that constitutes a housing together with the window 5 and the side wall 7. A reflector 3 is also mounted on the base 2. A part of the laser light emitted from the light-emitting rear facet 12 of the laser device 1 is reflected by a reflecting face 41 of the reflector 3 and then returns to the laser device 1. Wiring, functioning as an electric path, is omitted from FIG. 5 in order to simplify the drawing. A semiconductor chip can be used as the reflector 3, the reflecting face 41 of which is formed by, for example, coating a cleaved facet of the chip with a multilayered reflecting film made of a metal such as Au or a dielectric substance.

In the semiconductor laser device 1 with the above-mentioned structure, an external longitudinal mode $\lambda_e$ $(=2d\ (m_e+\frac{1}{2}))$, which depends upon the distance d between the light-emitting rear facet 12 and the reflecting face 41, arises. Accordingly, the semiconductor laser device 1 stably oscillates in the longitudinal mode near the peak of a gain distribution in which the internal longitudinal mode $\lambda(=2nl/m)$ depending upon the internal cavity length l agrees or nearly agrees with the above-mentioned external longitudinal mode $\lambda_e$, wherein m and $m_e$ are the integer and n is the effective refraction of the semiconductor laser waveguide. According to the experimental results obtained by the inventors of this invention, when the external cavity length d is 50 μm, a semiconductor laser apparatus oscillating laser light in a stable longitudinal mode in a wide temperature range over a 31° C. span at a fixed optical output power as shown in FIG. 6 is obtainable. The characteristics of such a semiconductor laser apparatus meet the requirements necessary for the optical system. In general, in order to stabilize the intensity of laser light emitted from semiconductor lasers, the semiconductor lasers must be provided with a monitoring structure in which the intensity of laser light from the light-emitting front facet is monitored by detecting the laser light from the light-emitting rear face by the use of a photodetector. However, the semiconductor laser with the structure shown in FIG. 5 cannot be provided with such a monitoring function because the laser light from the light-emitting rear facet 12 is intercepted by the reflector 3 before arriving at a photodetector. Thus, the semiconductor laser must have an optical apparatus leading a part of the laser light from the light-emitting front facet to the photodetector. FIG. 7 shows such an optical apparatus 8, which comprises a collimating lens 81 for collimating the laser light beams 131 from the light-emitting front facet 13, a beam splitter 82 for splitting the collimated laser beams into two components 132 and 133, a condensing lens 83 for condensing the light beam 132, and a condensing lens 84 for condensing the light beam 133. The light beam 132 condensed by the condensing lens 83 is used as a light source for reading and/or writing information, whereas the light beam 133 condensed by the condensing lens 84 is incident on an optical detector 85 for detecting the optical output power of the semiconductor laser. It is extremely difficult to dispose each of the optical means with high precision. Moreover, since a part of the laser light from the front facet of the semiconductor laser is used as a light for monitoring the intensity of laser light emitted from the front facet of the semiconductor laser, the optical output intensity of the semiconductor laser is weakened.

SUMMARY OF THE INVENTION

The semiconductor laser apparatus of this invention, which overcomes the above-discussed and numerous other disadvantages and deficiencies of the prior art, comprises a semiconductor laser device, a reflector positioned behind said laser device in a manner to face the light-emitting rear facet of said laser device, and a photodetector, for detecting the optical output of said laser device, positioned backward of said reflector, wherein a part of the laser light from said light-emitting rear facet is reflected by said reflector and the reflected light is then incident to said photodetector.

In a preferred embodiment, the reflector has a first reflecting face that is disposed in parallel to the light-emitting rear facet of said laser device and that returns the reflected light from said reflecting face to said laser device and a second reflecting face that is disposed with an inclination to the light-emitting rear facet of said laser device and that reflects a part of the laser light from the light-emitting rear facet to said photodetector.

Alternatively, a part of the laser light from the light-emitting rear facet travels back and forth at least once between the reflector and the light-emitting rear facet and is then incident as a monitoring light on said photodetector. The thickness of the portion of said reflector, which is in the position higher than the position of the active layer of said laser device, in a preferred embodiment, is smaller than the distance between said laser device and said reflector. The active layer is, in a preferred embodiment, located in the middle position of said laser device in the thickness direction. The thickness of the portion of said reflector, which is in the position higher than the position of the active layer of said laser device, in a preferred embodiment, is one half or less that of the portion of said laser device, which is in the position higher than the position of the active layer.

Thus, the invention described herein makes possible the objects of (1) providing a semiconductor laser device which produces laser light with a stabilized oscillation wavelength; (2) providing a semiconductor laser apparatus which functions to detect the intensity of laser light emitted from the semiconductor laser apparatus without adding a complicated optical system thereto; (3) providing a semiconductor laser apparatus in which the amount of light used for writing and/or reading information is not decreased, because an optical system for splitting laser light from the light-emitting facet of a semiconductor laser device incorporated into said semiconductor laser apparatus is not required, thereby attaining a high density design and high speed operation; and (4) providing a semiconductor laser apparatus in which the detection of the intensity of laser light emitted from a semiconductor laser device incorporated into said semiconductor laser apparatus can be carried out with reproducibility by the use of a simple optical structure, and accordingly precise and complicated adjustment of the optical axis in this system is not required, which causes a significant decrease in cost.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

EXAMPLE 1

Figure 1:
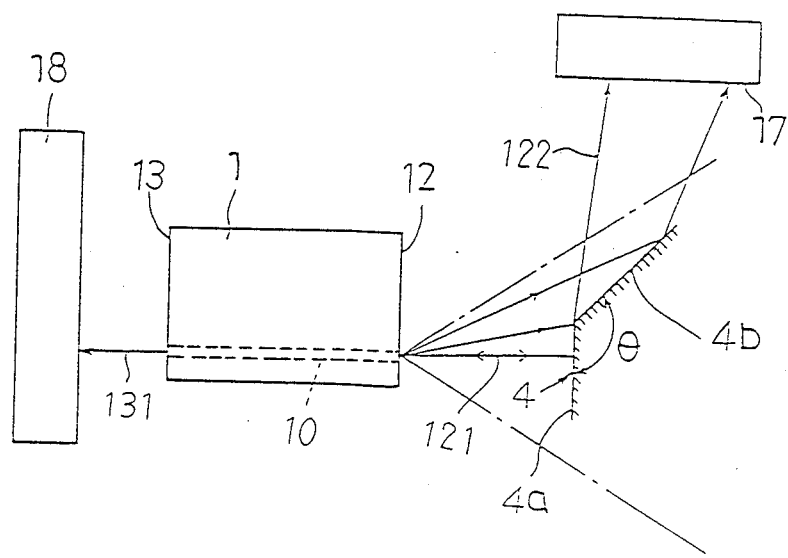
FIG. 1 is a diagram showing a semiconductor laser apparatus of this invention.

FIG. 1 shows a semiconductor laser apparatus of this invention, which comprises a semiconductor laser device 1, a reflector 4 positioned at a distance from the light-emitting rear facet 12 of the laser device 1, and a photodetector 17 positioned near the reflector 4. The reflector 4 has a reflecting face 4a, which is parallel to the light-emitting rear facet 12 and which functions to return a part of the light from the rear facet 12 to the laser device 1, and a reflecting face 4b, which is at an angle of $\theta$ to the reflecting face 4a and which leads another part of the laser light from the rear facet 12 to the photodetector 17.

The laser light 121 is emitted, with a spread such as that shown by the dotted lines, from the light-emitting rear facet 12. The reflecting faces 4a and 4b are positioned within the extent of the spreading of the laser light 121. Thus, a part of the laser light 121 from the light-emitting rear facet 12 is reflected by the reflecting face 4a and returns to the semiconductor laser device 1, resulting in an external resonator. On the other hand, another part of the laser light 121 from the light-emitting rear facet 12 is reflected by the reflecting face 4b and the reflected light is then incident on the photodetector 17 by which the optical output intensity of the semiconductor laser device 1 is detected.

The laser light 131 emitted from the light-emitting front facet 13 is used as a light source for the use of writing and/or reading information through an optical apparatus 18. Since the optical apparatus 18 is not required to have a light-detecting function such as that of a conventional optical apparatus, it can be a simple optical system consisting of an optical means such as a condensing lens, so that the laser light 131 can be effectively used for, for example, writing information without a decrease due to complicated optical systems.

This invention is not limited to the abovementioned example, but in addition to the reflecting faces 4a and 4b, the reflector 4 can be provided with other reflecting faces having different angles with regard to the light-emitting rear facet 12. For example, as the reflecting face for returning a part of the laser light 121 from the light-emitting rear facet 12 to laser device 1, a plurality of reflecting faces having different angles with regard to the light-emitting rear facet 12 are disposed, causing an interference effect based on the differences among the external cavity lengths, thereby attaining the excellent selection of longitudinal modes. Moreover, the semiconductor laser device 1 can be, of course, produced from other semiconductor materials other than the GaAs/GaAlAs system.

EXAMPLE 2

This example provides another external resonator type semiconductor laser apparatus, which comprises a semiconductor laser device, a reflector positioned behind the light-emitting rear facet of said laser device, and a photodetector positioned backward of said reflector, whereby laser light emitted from the light-emitting rear facet of the laser device is reflected at least once by each of said reflector and said rear facet and the reflected light is finally incident on the photodetector.

In general, laser light is emitted with a radial spread (which is similar to the Gaussian distribution) from the light-emitting facet of semiconductor lasers. That is, the spread of laser beams in the direction, which is vertical to the active layer of semiconductor lasers, has a half-width lobe of the half maximum of 10° to 20°. The relationship between the angle of spread of laser light from the light-emitting facet of the semiconductor laser device and the amount of laser light arriving at the photodetector is discussed below: The angle of spread $\theta_0$ of a laser light from the light-emitting rear facet of the semiconductor laser device, which directly arrives backward of the reflector, is represented by the formula (1):

$$\theta_0 > \tan^{-1}(h_M/d), \quad (1)$$

wherein $h_M$ is the thickness of the portion of the reflector that is in the position higher than that of the active layer of the semiconductor laser device, and d is the external cavity length, i.e., the distance between the reflecting face of the reflector and the light-emitting rear facet of the semiconductor laser device.

The angle of spread $\theta_1$ of a laser light from the light-emitting rear facet of the semiconductor laser device, which arrives backward of the reflector after it is reflected once by each of the reflector and the rear facet of the laser device, is represented by the formula (2):

$$\tan^{-1}(h_M/d) > \theta_1 \geq \tan^{-1}(h_M/d \times 3) \quad (2)$$

The amount of light arriving backward of the reflector is decreased whenever the laser light from the rear facet of the laser device is reflected by the reflector and the rear facet of the laser device, so that the coefficient of the amount of light, $\alpha_1$, arriving at the photodetector can be represented by the formula (3):

$$\alpha_1 = R_r R_M, \quad (3)$$

wherein $R_r$ is the reflectivity of the rear facet of the semiconductor laser device and $R_M$ is the reflectivity of the reflecting face of the reflector.

Thus, the angle of spread $\theta m$ of a laser light from the light-emitting rear facet, which arrives backward of the reflector after it travels back and forth m times between the reflecting face of the reflector and the light-emitting rear facet of the laser device, can be represented by the formula (4) and the coefficient of the amount of light, $\alpha_m$, arriving at the photodetector after traveling back and forth m times between the reflecting face and the rear facet can be represented by the formula (5):

$$\theta_{m-1} > \theta_m \geq \tan^{-1}[h_M/d(2m+1)], \quad (4)$$

$$\alpha_m = (R_r R_M)^m, \quad (5)$$

wherein m = 0, 1, 2, 3, ...

Figure 4:
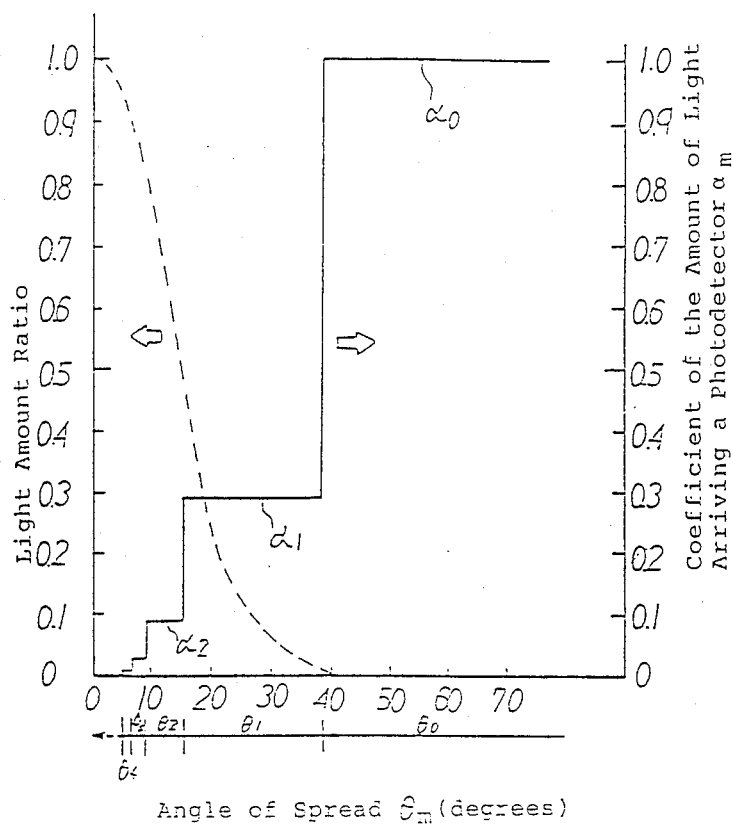
FIG. 4 contains curves showing the relationship among the angle of spread of laser light in the vertical direction from the light-emitting rear facet of a semiconductor laser device, the ratio of the amount of laser light, and the coefficient of the amount of laser light arriving at a photodetector.

FIG. 4 shows the relationship between $\theta m$ and $\alpha_m$, wherein $h_M = 40$ μm, d = 50 μm, $R_r = 0.32$, and $R_M = 0.9$. The curve indicated by the dotted line in FIG. 4 shows the relationship between the angle of spread $\theta_m$ of laser light from the light-emitting rear facet of the laser device and the ratio of the amount of light from the light-emitting rear facet of the laser device. FIG. 4 indicates that when $\theta_m$ is large, although the laser light directly arrives backward of the reflecting means (e.g., when $\theta \geq 39°$, $\alpha = 1$), the amount of light from the laser device is small. FIG. 4 also indicates that when $\theta$ is small, although the amount of light from the laser device is large, the light travels back and forth many times between the reflecting face of the reflector, and the rear facet of the laser device, causing a decrease in $\alpha$. This means that whenever $\theta$ is excessively large or small, the amount of light arriving backward of the reflecting means becomes small. Thus, in order to maintain he amount of light at a relatively high level, it is preferable that $\theta$ is selected to be in the range of 6.5° to 39°, that is, m is selected to be 1 (i.e., $\theta = 15°$ to 39°), 2 (i.e., $\theta = 9°$ to 15°) or 3 (i.e., $\theta = 6.5°$ to 9°). As seen from the formulas (4) and (5), the amount of light arriving backward of the reflector (i.e., the amount of light to be used for monitoring the optical output intensity of the laser device) increases with an increase in d, $R_r$, and $R_M$ or with a decrease in $h_M$. However, it is experimentally known that d must be in the range of 30 to 70 μm in order to stabilize the oscillation wavelength of laser light produced by the laser device. Moreover, when $R_r$ is set to be excessively large, the amount of light returning to the laser device is reduced, which causes a decrease in the function of the external resonator. $R_M$ is preferably set to be large, 0.9 to 1. The very small portion of the reflecting face of the reflector, which is positioned in the resonation direction of the semiconductor laser device, constitutes an external resonator together with the semiconductor laser device, so that $h_M$ can be theoretically set to be small.

On the other hand, when the thickness $h_L$ of the portion of the semiconductor laser device, which is in the position higher than the active layer of the semiconductor laser device, is two times or less the thickness $h_M$ of the portion of the reflector, which is in the position higher than that of the active layer of the semiconductor laser device, the laser light reflected by the reflector goes forward of the laser device without returning to the rear facet of the laser device. In order to avoid such a phenomenon, the selection of the value of $h_M$ must be carefully determined.

As mentioned above, when $h_M$ is set to be small, a laser light from the laser device is reflected once at least by each of the reflector and the rear facet and the reflected light is then incident on the photodetector, so that the amount of light to be used for monitoring the optical output intensity of the laser device can be obtained without decreasing the oscillation wavelength stabilizing function of the semiconductor laser apparatus.

Figure 2:
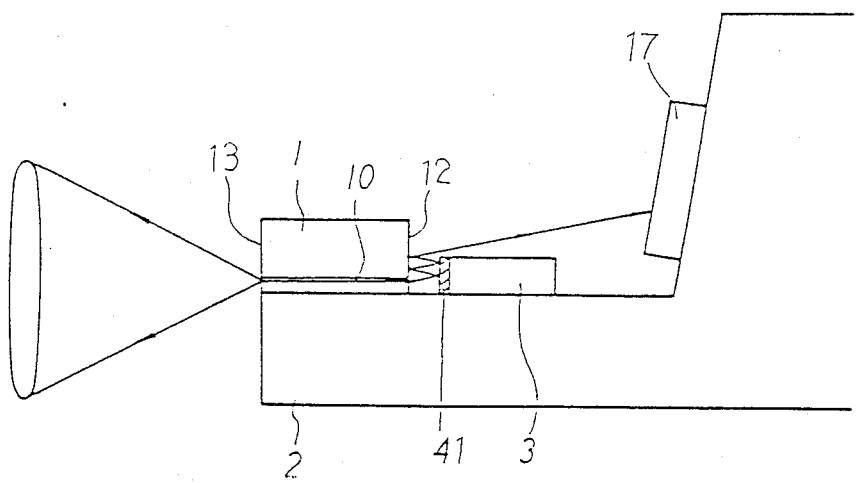
FIG. 2 is a diagram showing another semiconductor laser apparatus of this invention.
Figure 5:
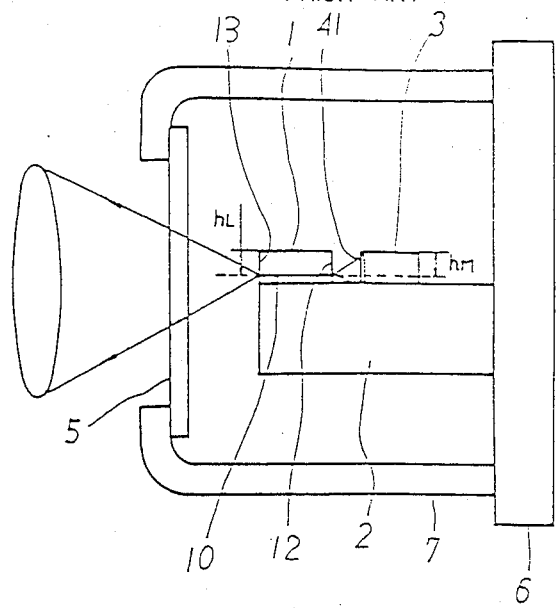
FIG. 5 is a diagram showing a conventional semiconductor laser apparatus.
Figure 6:
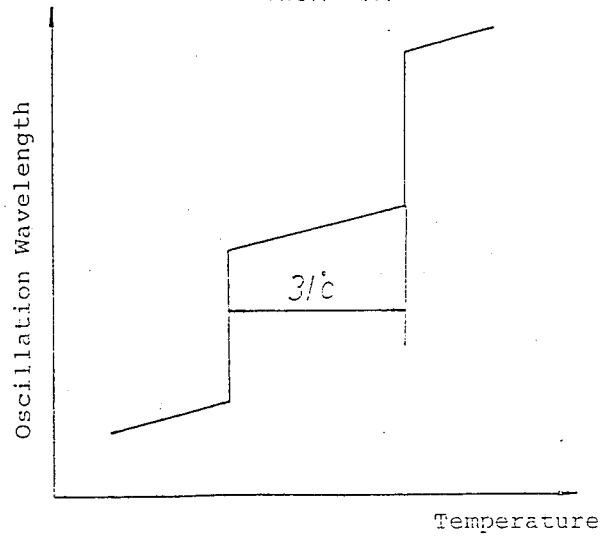
FIG. 6 is a curve showing the relationship between the temperature and the oscillation wavelength with regard to conventional external resonator type semiconductor lasers.
Figure 7:
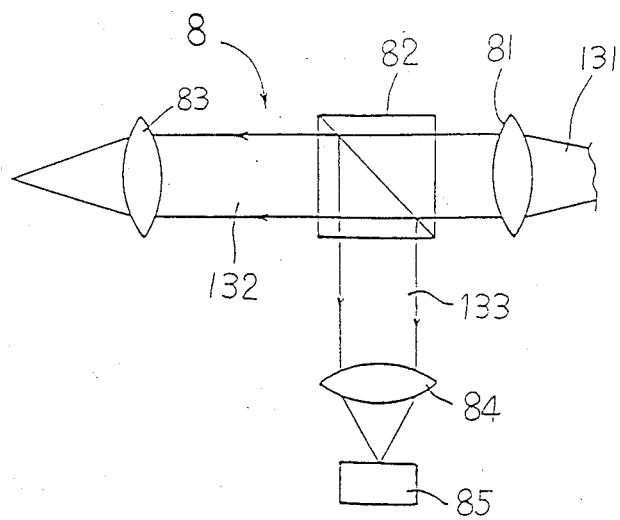
FIG. 7 is a diagram showing an additional optical apparatus for monitoring the intensity of laser light emitted from the front facet of the semiconductor laser device of the conventional semiconductor laser apparatus shown in FIG. 5.

The external resonator type semiconductor laser apparatus of this example is described below in greater detail: As shown in FIG. 2, the semiconductor laser apparatus comprises a semiconductor laser device 1 mounted on the base 2, a reflector 3 positioned behind the laser device 1 at a given position on the base 2 in such a manner that the reflecting face 41 of the reflector 3 faces the light-emitting rear facet 12 of the laser device 1, resulting in an external resonator. A photodetector 17 such as a solar cell is fixed backward of the reflector 3 on the base 2. These components 1, 2, 3, and 17 are held in a housing such as that shown in FIG. 5, and laser light from the laser device 1 is radiated outside through the window of the housing.

When current is injected into the laser device 1, the laser device 1 oscillates to thereby emit laser light forward and backward from the active layer 10 of the laser device 1. The laser light emitted forward is used for, for example, writing and/or reading information, whereas the laser light emitted backward is reflected by the reflecting face 41 of the reflector 3 and then turns to the rear facet 12 of the laser device 1. Due to the external resonator structure mentioned above, the semiconductor laser device 1 attains laser oscillation in a stable longitudinal mode. The reflected light from the reflector 3 to the laser device 1 is again reflected by the rear facet 12 and is incident on the reflector 3. Since the laser light emitted from the rear facet 12 of the laser device 1 has an angle of spread, it spreads stepwise upward from the reflecting face 41 of the reflector 3 while the laser light travels back and forth many times between the rear facet 12 and the reflecting face 41, and the reflected light finally proceeds as a monitoring light toward the photodetector 17, which detects the intensity of the laser light to produce an electrical output signal corresponding to the said optical intensity. Thus, by the detection of the electrical output signal corresponding to the amount of light arriving at the photodetector 17, the intensity of light emitted from the laser device 1 can be monitored. Moreover, by the feedback of the said electrical output signal to a driving circuit of the semiconductor laser device 1 so as to control current driving the semiconductor laser device 1, the intensity of laser light from the semiconductor laser device 1 can be maintained at a fixed level.

In the above-mentioned example, the active layer 10 was positioned to be 5 μm in height from the surface of the base 2. The external cavity length d corresponding to the distance between the rear facet 12 and the reflecting face 41 was 50 μm, and the thickness of the reflector 3 was 45 μm. The reflectivity of the reflecting face 41 was 0.9. The reflecting face 41 was formed by a vapor deposition metal film or a plating film. The reflectivity of the rear facet 12 of the semiconductor laser device 1 was 0.32. Therefore, $h_M$ was 40 μm, d was 50 μm, $R_r$ was 0.32, and $R_M$ was 0.9, and the optical output of the semiconductor laser device 1 was monitored by the photodetector 17 under the conditions described above with regard to FIG. 4.

EXAMPLE 3

Figure 3:
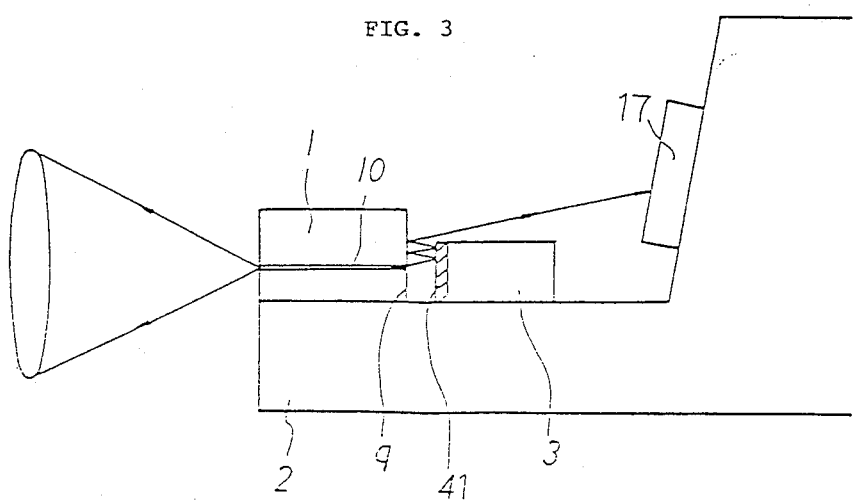
FIG. 3 is a diagram showing another semiconductor laser apparatus of this invention.

FIG. 3 shows another semiconductor laser apparatus of this invention, which has the same structure as that of Example 2 shown in FIG. 2, except that the active layer 10 of the semiconductor laser device 1 is positioned to be 60 μm in height from the surface of the base 2 and the thickness of the reflector 3 is 100 μm. This laser apparatus provided the amount of light that is sufficient to monitor the optical output of the semiconductor laser device 1 in the same manner as in Example 2. Although the active layer is located near the surface of the mounting base in order to improve the heat radiation thereof as shown in FIG. 2, even though it is located in the middle portion of the semiconductor laser device as described in this example, reliability of the semiconductor laser apparatus did not decreased. This means that the thickness of the reflector can be set to be great, which makes the manufacture of the reflector easy.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In an external resonator type semiconductor laser apparatus having a front light-emitting facet, a rear light-emitting facet, a reflector having first and second reflecting portions positioned to receive and reflect laser light emanating from said rear light-emitting facet, and a photodetector for monitoring said laser light, the device wherein said first reflecting portion is disposed in parallel to the light-emitting rear facet of said laser device and returns the reflected light from said reflecting portion to said laser device, and said second reflecting portion is disposed with an inclination to the light-emitting rear facet of said laser device and in the position adjacent to said first reflecting portion and reflects a part of the laser light from the light-emitting rear facet to said photodetector.

2. In an external resonator type semiconductor laser apparatus having a front light-emitting facet, a rear light-emitting facet, a reflector positioned to reflect laser light emanating from said rear light-emitting facet back to said rear light-emitting facet, and a photodetector for monitoring said laser light, the device wherein a part of the laser light from the light-emitting rear facet travels back and forth at least once between the reflector and the light-emitting rear facet and is then incident as a monitoring light on said photodetector.

3. An external resonator type semiconductor laser apparatus according to claim 2, wherein the thickness of the portion of said reflector, which is in the position higher than the position of the active layer of said laser device, is smaller than the distance between said laser device and said reflector.

4. An external resonator type semiconductor laser apparatus according to claim 3, wherein the active layer is located in the middle position of said laser device in the thickness direction.

5. An external resonator type semiconductor laser apparatus according to claim 4, wherein the thickness of the portion of said reflector, which is in the position higher than the position of the active layer of said laser device, is one half or less that of the portion of said laser device, which is in the position higher than the position of the active layer.

* * * * *

UNITED STATES PATENT AND TRADEMARK OFFICE
CERTIFICATE OF CORRECTION

PATENT NO. : 4,817,109

DATED : March 28, 1989

INVENTOR(S) : Nobuyuki Miyauchi et al.

It is certified that error appears in the above-identified patent and that said Letters Patent is hereby corrected as shown below:

Title Page:
Under the title, item [75], please change "Nobuybuki" to --Nobuyuki--.

Column 1, line 51, the expression "$(=2d(m_e+1/2))$" should read --$(=2d/(m_e+1/2))$--.

Column 4, line 28, please change "abovementioned" to --above-mentioned--.

Column 5, line 1, the expression "$\theta_0 > \tan^{-1}(h_M/d)$" should read --$\theta_0 \geq \tan^{-1}(h_M/d)$--;

Column 5, line 28, the expression "$\theta m$" should read --$\theta_m$--;

Column 5, line 34, the expression "$\alpha m$" should read --$\alpha_m$--;

Column 5, line 43, the expression "$\theta m$" should read --$\theta_m$--;

UNITED STATES PATENT AND TRADEMARK OFFICE
CERTIFICATE OF CORRECTION

PATENT NO. : 4,817,109
DATED : March 28, 1989
INVENTOR(S) : Noboyuki Miyauchi et al.

It is certified that error appears in the above-identified patent and that said Letters Patent is hereby corrected as shown below:

Column 5, line 61, please change "he" to --the--;

Column 5, line 63, boldface "1" should be normal --1--;

Column 5, line 63, boldface "2" should be normal --2--; and

Column 5, line 64, boldface "3" should be normal --3--.

UNITED STATES PATENT AND TRADEMARK OFFICE
CERTIFICATE OF CORRECTION

PATENT NO. : 4,817,109

DATED : March 28, 1989

INVENTOR(S) : Noboyuki Miyauchi et al

It is certified that error appears in the above-identified patent and that said Letters Patent is hereby corrected as shown below:

Column 7, line 41, please change "decreased" to
--decreased--.

Signed and Sealed this

Third Day of November, 1992

Attest:

DOUGLAS B. COMER

Attesting Officer   Acting Commissioner of Patents and Trademarks